(12) United States Patent
Shchemelinin et al.

(10) Patent No.: US 9,390,892 B2
(45) Date of Patent: Jul. 12, 2016

(54) LASER SUSTAINED PLASMA LIGHT SOURCE WITH ELECTRICALLY INDUCED GAS FLOW

(71) Applicant: KLA-Tencor Corporation, Milpitas, CA (US)

(72) Inventors: Anatoly Shchemelinin, Pleasanton, CA (US); Ilya Bezel, Sunnyvale, CA (US)

(73) Assignee: KLA-Tencor Corporation, Milpitas, CA (US)

(*) Notice: Subject to any disclaimer, the term of this patent is extended or adjusted under 35 U.S.C. 154(b) by 401 days.

(21) Appl. No.: 13/924,608

(22) Filed: Jun. 23, 2013

(65) Prior Publication Data

US 2013/0342105 A1    Dec. 26, 2013

Related U.S. Application Data

(60) Provisional application No. 61/664,565, filed on Jun. 26, 2012.

(51) Int. Cl.
*H01J 7/24*    (2006.01)
*H05B 31/26*    (2006.01)
(Continued)

(52) U.S. Cl.
CPC ............ *H01J 37/32055* (2013.01); *H01J 61/04* (2013.01); *H01J 61/125* (2013.01);
(Continued)

(58) Field of Classification Search
CPC .................................................. H01J 37/32055
USPC ......................................... 315/111.21–111.71
See application file for complete search history.

(56) References Cited

U.S. PATENT DOCUMENTS 6,566,667 B1    5/2003 Partlo et al.
6,586,757 B2    7/2003 Melnychuk et al.
(Continued)

FOREIGN PATENT DOCUMENTS

JP    H05136098 A    6/1993
JP    2009087807 A    4/2006
(Continued)

OTHER PUBLICATIONS

International Search Report and Written Opinion mailed on Sep. 27, 2013, for PCT Application No. PCT/US2013/047811 filed on Jun. 26, 2013, by KLA-Tencor Corporation, 11 pages.
(Continued)

*Primary Examiner* — Sibin Chen
*Assistant Examiner* — Metasebia Retebo
(74) *Attorney, Agent, or Firm* — Spano Law Group; Joseph S. Spano

(57) ABSTRACT

A laser sustained plasma light source includes a plasma bulb containing a working gas flow driven by an electric current sustained within the plasma bulb. Charged particles are introduced into the working gas of the plasma bulb. An arrangement of electrodes maintained at different voltage levels drive the charged particles through the working gas. The movement of the charged particles within the working gas causes the working gas to flow in the direction of movement of the charged particles by entrainment. The resulting working gas flow increases convection around the plasma and increases laser to plasma interaction. The working gas flow within the plasma bulb can be stabilized and controlled by control of the voltages present on the each of the electrodes. A more stable flow of working gas through the plasma contributes to a more stable plasma shape and position within the plasma bulb.

16 Claims, 7 Drawing Sheets

(51) Int. Cl.
    *H01J 37/32*     (2006.01)
    *H01J 61/04*     (2006.01)
    *H01J 61/12*     (2006.01)
    *H01J 61/14*     (2006.01)
    *H01J 61/16*     (2006.01)
    *H01J 61/20*     (2006.01)
    *H01J 61/28*     (2006.01)
    *H01J 65/04*     (2006.01)

(52) U.S. Cl.
    CPC ............... *H01J 61/14* (2013.01); *H01J 61/16* (2013.01); *H01J 61/20* (2013.01); *H01J 61/28* (2013.01); *H01J 65/04* (2013.01)

(56) References Cited

U.S. PATENT DOCUMENTS

| | | | |
|---|---|---|---|
| 6,762,424 B2 | 7/2004 | Wester | |
| 6,894,298 B2 | 5/2005 | Ahmad et al. | |
| 7,705,334 B2 | 4/2010 | Shirai et al. | |
| 8,182,127 B2 | 5/2012 | Kato et al. | |
| 8,242,695 B2* | 8/2012 | Sumitomo | H01J 61/025 250/504 R |
| 8,309,943 B2 | 11/2012 | Casey et al. | |
| 8,358,069 B2* | 1/2013 | Sumitomo | G03F 7/70016 250/504 R |
| 2007/0228288 A1* | 10/2007 | Smith | B82Y 10/00 250/426 |
| 2008/0122369 A1* | 5/2008 | Nitschke | H01J 37/32935 315/111.21 |
| 2010/0164380 A1 | 7/2010 | Sumitomo | |
| 2011/0025221 A1 | 2/2011 | Matsumoto et al. | |
| 2011/0080093 A1* | 4/2011 | Walton | H01J 15/02 315/111.21 |
| 2012/0146509 A1* | 6/2012 | Hermanns | H01J 37/32045 315/111.21 |
| 2012/0313016 A1 | 12/2012 | Fleurov et al. | |
| 2013/0329204 A1* | 12/2013 | Pellemans | H05H 1/24 355/67 |

FOREIGN PATENT DOCUMENTS

| | | |
|---|---|---|
| JP | 2011023112 A | 2/2011 |
| JP | 2011119200 A | 6/2011 |
| WO | 98-28766 A1 | 7/1998 |

OTHER PUBLICATIONS

Aaron M. Drews, et al., "AC Electric Fields Drive Steady Flows in Flames," Physical Review E 86, 036314 (2012).

Jen-Shih Chang, et al., "Narrow-Flow-Channel-Driven EHD Gas Pump for an Advanced Thermal Management of Microelectronics," IEEE Transactions on Industry Applications, vol. 46, No. 3, pp. 1151-1158, May/Jun. 2010.

\* cited by examiner

LASER SUSTAINED PLASMA LIGHT SOURCE WITH ELECTRICALLY INDUCED GAS FLOW

CROSS REFERENCE TO RELATED APPLICATION

The present application for patent claims priority under 35 U.S.C. §119 from U.S. provisional patent application Ser. No. 61/664,565, entitled "Use of Electrical Gas Flow Control in Laser Sustained Plasma Light Source," filed Jun. 26, 2012, the subject matter of which is incorporated herein by reference.

TECHNICAL FIELD

The described embodiments relate to optical metrology and inspection systems for microscopy, and more particularly to optical metrology and inspection systems involving laser sustained plasma radiation sources.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Inspection processes are used at various steps during a semiconductor manufacturing process to detect defects on wafers to promote higher yield. When inspecting specular or quasi-specular surfaces such as semiconductor wafers bright field (BF) and dark field (DF) modalities may be used, both to perform patterned wafer inspection and defect review. In BF inspection systems, collection optics are positioned such that the collection optics capture a substantial portion of the light specularly reflected by the surface under inspection. In DF inspection systems, the collection optics are positioned out of the path of the specularly reflected light such that the collection optics capture light scattered by objects on the surface being inspected such as microcircuit patterns or contaminants on the surfaces of wafers. Viable inspection systems, particularly BF inspection systems, require high radiance illumination and a high numerical aperture (NA) to maximize the defect sensitivity of the system.

Current wafer inspection systems typically employ illumination sources of deep ultraviolet (DUV) radiation with a high numerical aperture (NA). In general, the defect sensitivity of an inspection system is proportional to the wavelength of the illumination light divided by the NA of the objective. Without further improvement in NA, the overall defect sensitivity of current inspection tools is limited by the wavelength of the illumination source.

In some examples of BF inspection systems, illumination light may provided by an arc lamp. For example, electrode-based, relatively high intensity discharge arc lamps are used in inspection systems. However, these light sources have a number of disadvantages. For example, electrode based, relatively high intensity discharge arc lamps have radiance limits and power limits due to electrostatic constraints on current density from the electrodes, the limited emissivity of gases as black body emitters, the relatively rapid erosion of electrodes made from refractory materials due to the presence of relatively large current densities at the cathodes, and the inability to control dopants (which can lower the operating temperature of the refractory cathodes) for relatively long periods of time at the required emission current.

To avoid the limitations of electrode based illumination sources, incoherent light sources pumped by a laser (e.g., laser sustained plasma) have been developed. Exemplary laser sustained plasma systems are described in U.S. Pat. No. 7,705,331 assigned to KLA-Tencor Corp., which is incorporated by reference as if fully set forth herein. Laser sustained plasmas are produced in high pressure bulbs surrounded by a working gas at lower temperature than the laser plasma. Substantial radiance improvements are obtained with laser sustained plasmas. Atomic and ionic emission in these plasmas generates wavelengths in all spectral regions, including shorter than 200 nm when using either continuous wavelength or pulsed pump sources. Excimer emission can also be arranged in laser sustained plasmas for wavelength emission at 171 nm (e.g., xenon excimer emission). Hence, a simple gas mixture in a high pressure bulb is able to sustain wavelength coverage at deep ultraviolet (DUV) wavelengths with sufficient radiance and average power to support high throughput, high resolution BF wafer inspection.

Development of laser sustained plasmas has been hampered by issues related to plasma instability caused by unpredictable working gas flows within the bulb. In particular, turbulent gas flows create uncertainty in the position of plasma and distort the plasma profile itself. In addition, the unpredictable gas flows destabilize the optical transmission properties of the working gas. This creates additional uncertainty in the pump light that reaches the plasma and the light extracted from the plasma.

Traditional laser sustained plasma light sources rely on natural convection to cool the laser sustained plasma. Structures may be added to influence the natural convective flows. However, the flow rates through the plasma are typically limited to approximately one meter per second, and flow instability and uncertainty introduces significant noise into the illumination system. Pressurized gas flow can be incorporated to increase the flow rate of working gas through the plasma, but control over the flow field within the plasma bulb is limited to regions near the exit of the nozzle delivering the pressurized flow. Typically, the nozzle must be located relatively far from the plasma. This limits precise control of the flow field in the plasma by pressurized gas flow itself. In addition, the mechanical systems employed to generate the pressurized working gas tend to have a relatively slow response time that limits their ability to be used as part of an active, real time flow control scheme to stabilize the laser sustained plasma.

As inspection systems with laser sustained plasma illumination sources are developed, maintaining plasma stability becomes a limiting factor in system performance. Thus, improved methods and systems for controlling working gas flows within a laser sustained plasma light source are desired.

SUMMARY

A laser sustained plasma light source includes a plasma bulb includes a working gas flow driven by an electric current sustained within the plasma bulb.

In one aspect, a charged particle source introduces charged particles into the working gas of the plasma bulb. An arrangement of electrodes maintained at different voltage levels drive the charged particles through the working gas. The movement of the charged particles within the working gas causes the working gas to flow in the direction of movement of the charged particles by entrainment. The resulting working gas flow increases convection around the plasma and increases laser to plasma interaction.

Charged particle emission into the working gas of the plasma bulb may be achieved by several different mechanisms. By way of non-limiting example, electron emission from an electrode may be achieved by corona discharge, photoelectric emission, thermionic emission form the electrode, or heating of the electrode by an electric arc.

Electric current is generated in the working gas by applying a voltage difference between two electrodes in different locations of the plasma bulb. The working gas flow within a plasma bulb can be stabilized and controlled by control of the electric current flowing through the working gas. A more stable flow of working gas through the plasma contributes to a more stable plasma shape and position within the plasma bulb. This decreases the noise present in the light emitted from the LSP light source. Control of the electric current flowing through the working gas may be achieved by controlling the voltage levels of one or more electrodes that influence the flow of electric current. In addition to stabilizing working gas flow through the plasma region, electric current flow may be employed to stabilize the flow of working gas in regions that interact with incoming laser light and emitted light. By stabilizing the working gas flow in these regions, the optical properties of the working gas in these regions are also stabilized, resulting in reduced noise present in the light emitted from the LSP light source. In addition to noise reduction, control of the gas flow through the plasma may be employed to modify the temperature distribution in the plasma. This changes the light-plasma interaction balance and plasma parameters such as size and radiation spectrum. In this manner, control over the light emission properties of the laser sustained plasma light source may be achieved by control of the gas flow through the plasma.

In another aspect, heat generated by a sustained flow of charged particles from one electrode to another in an electric arc generates a plume of working gas to flow through the plasma. A voltage difference between the electrodes is controlled to sustain the electric arc and the resulting working gas flow.

In yet another aspect, multiple electrodes are separately controlled to both generate charged particles and steer the charged particles through a working gas. The use of multiple electrodes introduces additional control flexibility over the working gas flow within a plasma bulb. This may enable improved stabilization of plasma shape and location.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Laser-sustained plasma light sources (LSPs) are capable of producing high-power and high-brightness broadband light suitable for metrology and inspection applications. LSPs operate by focusing laser radiation into a working gas volume to excite the gas into a plasma state that emits light. This effect is typically referred to as "pumping" the plasma with the laser radiation. A plasma bulb or gas cell is configured to contain the working gas species as well as the generated plasma. In some embodiments, a LSP is maintained with an infrared laser pump having a beam power on the order of several kilowatts. The laser beam is focused into a volume of a low or medium pressure working gas contained by a gas cell. The absorption of laser power by the plasma generates and sustains the plasma, for example, at plasma temperatures between 10,000 Kelvin and 20,000 Kelvin.

Figure 1:
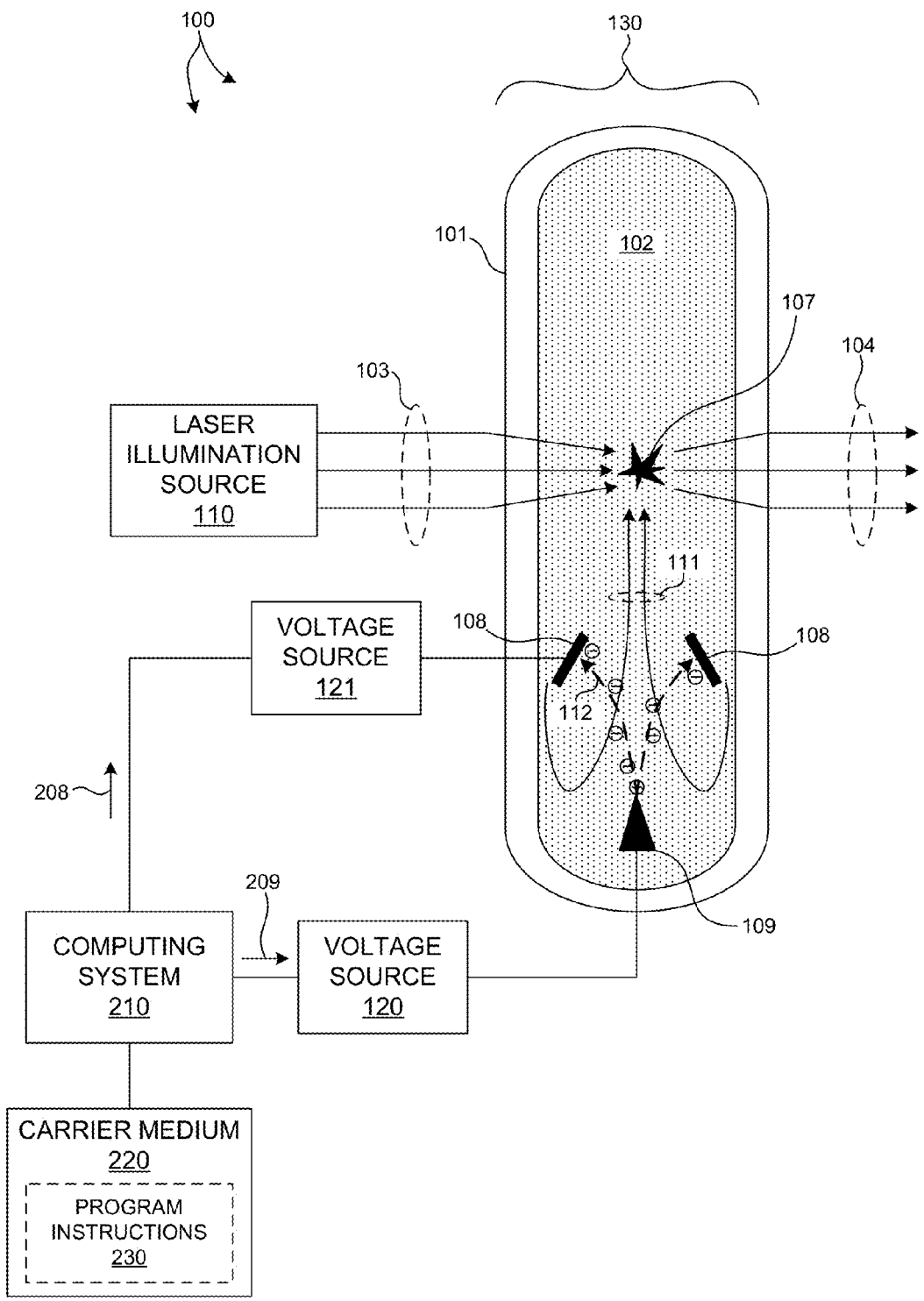
FIG. 1 is a simplified diagram illustrative of a laser sustained plasma light source 100 in a first embodiment including a flow of charged particles generated by a corona discharge.

FIG. 1 illustrates a laser sustained plasma light source 100 configured in accordance with one embodiment of the present invention. LSP 100 includes a laser illumination source 110 and a plasma bulb 130. Plasma bulb 130 includes at least one wall 101 formed from a material (e.g., glass) that is substantially transparent to at least a portion of the incoming light 103 generated by laser illumination source 110. Similarly, the at least one wall is also substantially transparent to at least a portion of the collectable illumination 104 (e.g., IR light, visible light, ultraviolet light) emitted by the plasma 107 sustained within the plasma bulb 130. For example, the wall 101 may be transparent to a particular spectral region of the broadband emission 104 from the plasma 107.

Plasma bulb 130 may be formed from a variety of glass or crystalline materials. In one embodiment, the glass bulb may be formed from fused silica glass. In some embodiments, the plasma bulb 130 may be formed from a low OH content fused synthetic quartz glass material. In other embodiments, the plasma bulb 130 may be formed high OH content fused synthetic silica glass material. For example, the plasma bulb 130 may include, but is not limited to, SUPRASIL 1, SUPRASIL 2, SUPRASIL 300, SUPRASIL 310, HERALUX PLUS, and HERALUX-VUV. In some embodiments, a glass material forming the plasma bulb 130 may be doped with fluorine, hydrogen, etc. Various glasses suitable for implementation in the plasma bulb of the present invention are discussed in detail in A. Schreiber et al., Radiation Resistance of Quartz Glass for VUV Discharge Lamps, J. Phys. D: Appl. Phys. 38 (2005), 3242-3250, which is incorporated herein in the entirety. In some embodiments, the plasma bulb 130 may be formed from a crystalline material such as a crystalline quartz material, a sapphire material, calcium fluoride, or magnesium fluoride.

In the illustrated embodiment, plasma bulb 130 includes a cylindrical shape with spherical ends. In some embodiments, plasma bulb 130 includes any of a substantially spherical shape, a substantially cylindrical shape, a substantially ellipsoidal shape, and a substantially prolate spheroid shape. These shapes are provided by way of non-limiting example. However, many other shapes may be contemplated.

It is contemplated herein that a refillable plasma bulb 130 may be utilized to sustain a plasma in a variety of gas environments. In one embodiment, the working gas 102 of the plasma bulb 130 may include an inert gas (e.g., noble gas or non-noble gas) or a non-inert gas (e.g., mercury) or their mixtures. For example, it is anticipated herein that the volume of working gas of the present invention may include argon. For instance, the working gas may include a substantially pure argon gas held at pressure in excess of 5 atmospheres. In another instance, the working gas may include a substantially pure krypton gas held at pressure in excess of 5 atmospheres. In general, the plasma bulb 130 may be filled with any gas known in the art suitable for use in laser sustained plasma light sources. In addition, the working gas may include a mixture of two or more gases. By way of non-limiting example, the working gas may include any one or combination of Ar, Kr, Xe, He, Ne, $N_2$, $Br_2$, $Cl_2$, $I_2$, $H_2O$, $O_2$, $H_2$, $CH_4$, NO, $NO_2$, $CH_3OH$, $C_2H_5OH$, $CO_2$, $NH_3$ one or more metal halides, a Ne/Xe mixture, an Ar/Xe mixture, a Kr/Xe mixture, an Ar/Kr/Xe mixture, an ArHg mixture, a KrHg mixture, and a XeHg mixture. In general, the present invention should be interpreted to extend to any light pumped plasma generating system and should further be interpreted to extend to any type of working gas suitable for sustaining a plasma within a plasma bulb.

In one novel aspect, the proposed laser sustained plasma light source includes a plasma bulb with a sustained working gas flow driven by an electric current sustained within the plasma bulb. In one further aspect, a charged particle source introduces charged particles into the working gas of the plasma bulb. An arrangement of electrodes maintained at different voltage levels drive the charged particles through the working gas. The movement of the charged particles within the working gas causes the working gas to flow in the direction of movement of the charged particles by entrainment. The resulting working gas flow increases convection around the plasma and increases laser to plasma interaction.

In some embodiments, electric current is generated in the working gas by applying a voltage difference between two electrodes located in different locations of the plasma bulb. In some of these embodiments, negatively charged particles (e.g., electrons, negatively charged ions, etc.) escape a negatively charged electrode (i.e., cathode) and drift to a positively charged electrode (i.e., anode). The movement of the negatively charged particles effectively drags molecules of the working gas along the path of electric current flowing from the cathode to the anode as a result of elastic and non-elastic scattering with atoms of the working gas. In some other embodiments, positively charged particles (e.g., positively charged ions, etc.) escape a positively charged electrode (i.e., anode) and drift to a negatively charged electrode (i.e., cathode). Similarly, the movement of the positively charged particles effectively drags molecules of the working gas along the path of electric current flowing from the anode to the cathode as a result of elastic and non-elastic scattering with atoms of the working gas. Although many of the methods and embodiments described herein refer to electrons as the charged particles flowing through the working gas, in general, any charged particle may be contemplated within the scope of description provided herein.

The resulting flow velocity is higher than the velocity of free convection flow and is always directed along the path of electric current regardless of the orientation of the plasma bulb in a gravitational field. The increased working gas flow velocity through the plasma increases the cooling of the periphery of the plasma. This reduces absorption of pump light at the periphery of the plasma and improves extraction of light emitted from the plasma. In addition, by confining pump light absorption to a smaller volume, a smaller, brighter plasma results.

Furthermore, the working gas flow within a plasma bulb can be stabilized and controlled by control of the electric current flowing through the working gas. Most of the working gas volume is non-ionized, thus the flow generation force is uniformly distributed along the path of electric current. This enables fast control of the flow and can be used for active stabilization of plasma properties. A more stable flow of working gas through the plasma contributes to a more stable plasma shape and position within the plasma bulb. This decreases the noise present in the light emitted from the LSP light source. Control of the electric current flowing through the working gas may be achieved by controlling the voltage levels at one or more electrodes that influence the flow of electric current. In some examples, the voltage levels may be adjusted to steer the electric current flow through the working gas. In some examples, the voltage levels between two or more electrodes may be reversed to drive the flow of electric current in the opposite direction.

In addition to stabilizing working gas flow through the plasma region, electric current flow may be employed to stabilize the flow of working gas in regions that interact with incoming laser light and emitted light. By stabilizing the working gas flow in these regions, the optical properties of the working gas in these regions are also stabilized, resulting in reduced noise present in the light emitted from the LSP light source.

Charged particle emission from an electrode may be achieved by several different mechanisms. By way of non-limiting example, electron emission from a cathode may be achieved by corona discharge, photoelectric emission, heating of the electrode by passing current through a resistive filament, or heating of the electrode by an electric arc.

In the embodiment depicted in FIG. 1, an electrode 109 is located within plasma bulb 130. In addition, electrode 108 is also located within plasma bulb 130 and is separated from electrode 109. In the depicted embodiment, electrode 108 is a circular, ribbon shaped electrode that wraps around a central, longitudinal axis of the axi-symmetric plasma bulb 130. Hence, electrode 108 appears in two locations in the cross-sectional view of FIG. 1. Electrode 109 is shaped with a sharp point to promote corona discharge from electrode 109. In this embodiment, corona discharge is employed to increase the emission of charged particles from electrode 109. Electrode 109 may be coated or doped with materials to decrease the work function of the surface of electrode 109 and increase emitted current. Materials employed in typical direct current discharge lamps (e.g., Thorium, Barium Oxide, etc.) may be used. However, other materials may be contemplated.

As depicted, electrode 109 is coupled to a voltage source 120. In the depicted embodiment, voltage source 120 is configured to supply a high, negative voltage to electrode 109 to stimulate the discharge of electrons from the tip of electrode 109. In addition, voltage source 121 is coupled to electrode 108 and is configured to supply a positive voltage to electrode 108 to attract the electrons emitted from electrode 109. Although voltage sources 120 and 121 are depicted as separate voltage sources, in some other embodiments, a single voltage source may be configured to supply the desired voltage difference between electrodes 108 and 109. An electric current 112 results from the movement of electrons from electrode 109 to electrode 108. The flow of electrons entrains a portion of working gas 102. This results in a working gas flow 111 that passes through the region of plasma 107.

Although, as depicted, electrode 108 is located within plasma bulb 130 between plasma 107 and electrode 109, other configurations may be contemplated. For example, in some embodiments, electrode 108 may be disposed on a side of plasma 107 opposite electrode 109. In these embodiments, electric current 112 passes through plasma 107 along with entrained working gas flow 111. In another example, electrode 108 may be located outside of plasma bulb 130. In these embodiments, the electrons are effectively steered by electrode 108, but are not ultimately absorbed by electrode 108. In yet another example, electrode 109 may be employed to emit charged particles into working gas 102 by corona discharge, but multiple electrodes may be employed to direct the flow of charged particles through working gas 102. In the depicted example, the differing voltages of electrode 109 and 108 generate an electric field that drives the flow of charged particles through working gas 102. However, in some other embodiments, different voltages may be applied to electrode 108 and another electrode (not shown). In these embodiments, the electric field generated between these electrodes drives the flow of charged particles through working gas 102.

In one further aspect, the flow of working gas 111 in plasma bulb 130 is actively controlled by control of the voltages supplied to each of the electrodes of the LSP light source 100. In the embodiment depicted in FIG. 1, command signal 208 is communicated from computing system 210 to voltage source 121. Voltage source 121 supplies a voltage level to electrode 108 based on command signal 208. Similarly, command signal 209 is communicated from computing system 210 to voltage source 120. Voltage source 120 supplies a voltage level to electrode 109 based on command signal 209.

The driving force for the working gas flow is proportional to both the electric current and the accelerating voltage. By controlling the voltage level of electrode 109, the number of charged particles introduced into working gas 102 can be controlled. In addition, by controlling the voltage difference between electrodes 109 and 108, the strength of the electric field between the two electrodes and the resulting effective velocity of the entrained working gas flow 111 can be controlled.

In some examples, computing system 210 determines the desired voltage levels of each electrode based on an image of plasma 107. In some other examples, computing system 210 determines the desired voltage levels of each electrode based on operating conditions of LSP light source 100 (e.g., luminious flux or intensity of incoming light 103, luminous flux or intensity of collectable illumination 104, temperature of plasma 107, temperature of plasma bulb 130, etc.). In these examples, computing system 210 is configured to receive one or more signals indicative of operating conditions of LSP light source 100 and determine control signals 208 and 209 based at least in part on the received signals.

It should be recognized that the various steps described throughout the present disclosure may be carried out by a single computer system 210 or, alternatively, a multiple computer system 210. Moreover, different subsystems of a metrology system employing a laser sustained plasma light source may include a computer system suitable for carrying out at least a portion of the steps described herein. Therefore, the description presented herein should not be interpreted as a limitation on the present invention but merely an illustration. Further, the one or more computing systems 210 may be configured to perform any other step(s) of any of the method examples described herein.

The computer system 210 may be configured to receive and/or acquire data or information from the subsystems of the system (e.g., laser illumination source 110, sensors associated with plasma bulb 130, and the like) by a transmission medium that may include wireline and/or wireless portions. In this manner, the transmission medium may serve as a data link between the computer system 210 and other subsystems. Further, the computing system 210 may be configured to receive parameters or instructions via a storage medium (i.e., memory). For instance, signals indicative of the operating conditions of LSP light source 100 may be stored in a permanent or semi-permanent memory device (e.g., carrier medium 220). In this regard, the signals may be imported from an external system.

Moreover, the computer system 210 may send data to external systems via a transmission medium. The transmission medium may include wireline and/or wireless portions. In this manner, the transmission medium may serve as a data link between the computer system 210 and other subsystems or external systems. For example, computer system 210 may send results generated by computer system 210 to external systems or to other subsystems of via a transmission medium.

The computing system 210 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 230 implementing methods such as those described herein may be transmitted over or stored on carrier medium 220. The carrier medium may be a transmission medium such as a wire, cable, or wireless transmission link. The carrier medium may also include a computer-readable medium such as a read-only memory, a random access memory, a magnetic or optical disk, or a magnetic tape.

Furthermore, in some embodiments, the voltage control functionality realized by computing system 210 as described herein is performed entirely, or in part, by an analog computing system.

Figure 2:
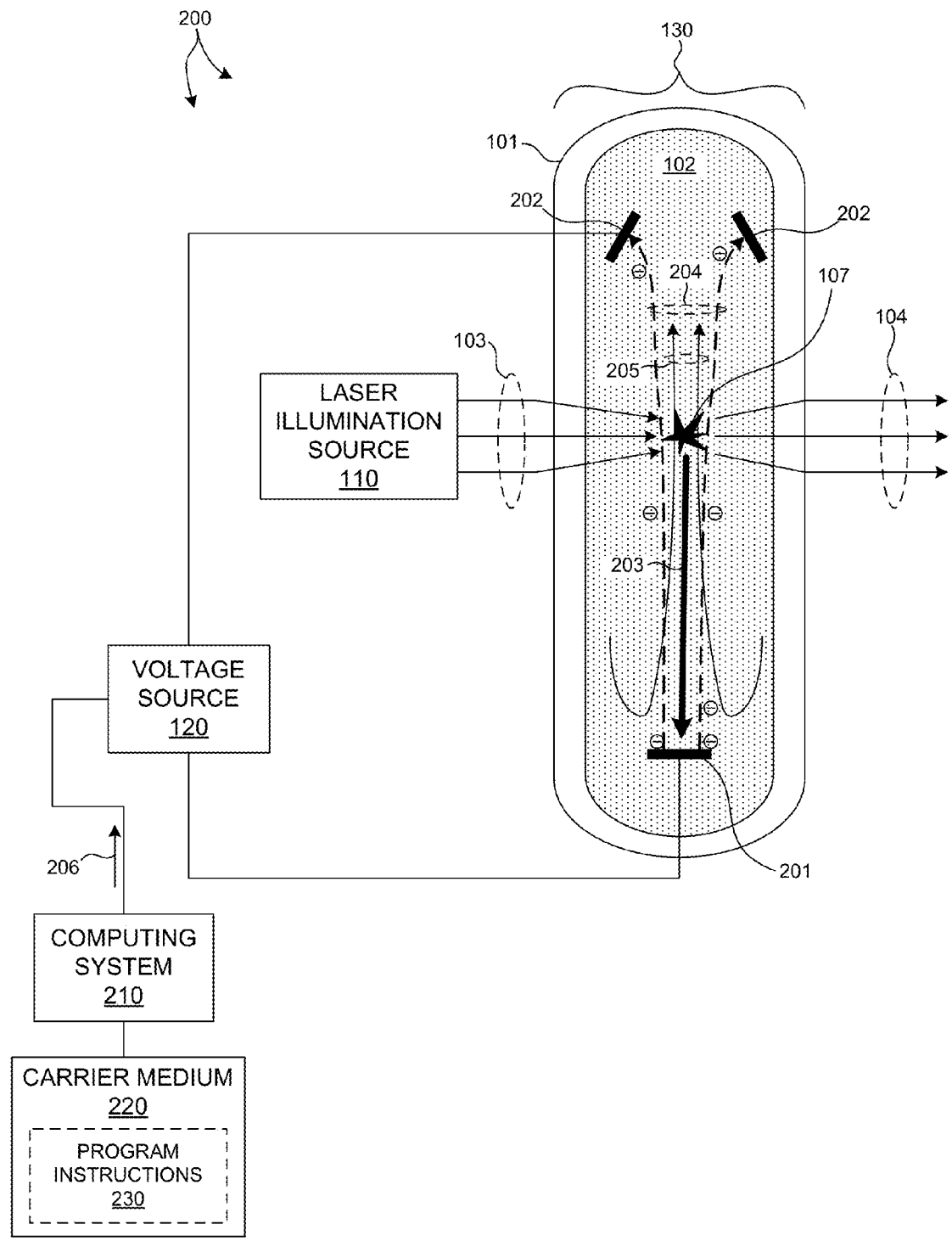
FIG. 2 is a simplified diagram illustrative of a laser sustained plasma light source 200 in a second embodiment including a flow of charged particles generated by photoelectric emission.

FIG. 2 illustrates LSP light source 200 in another embodiment of the present invention. As illustrated in FIG. 2, LSP light source 200 includes similar, like numbered elements described with reference to FIG. 1. However, in the configuration illustrated in FIG. 2, the charged particles are generated by photoelectric emission from electrode 201. As depicted in FIG. 2, radiation 203 from plasma 107 irradiates a surface of electrode 201. As described with respect to FIG. 1, electrode 109 is shaped with a pointed tip to promote corona discharge. In contrast, electrode 201 is shaped with a relatively large surface area to promote photoelectric emission stimulated by radiation 203 from the plasma 107. Electrode 201 may be coated or doped with materials to decrease the work function of the surface of electrode 201 and increase emitted current. Materials employed in typical direct current discharge lamps (e.g., Thorium, Barium Oxide, etc.) may be used. However, other materials may be contemplated.

As depicted in FIG. 2, electrode 201 is coupled to voltage source 120. In the depicted embodiment, voltage source 120 is configured to supply a voltage difference between electrode 201 and electrode 202 to drive electrons emitted from electrode 201 toward electrode 202. An electric current 204 results from the movement of electrons from electrode 201 to electrode 202. The flow of electrons entrains a portion of working gas 102. This results in a working gas flow 205 that passes through the region of plasma 107.

Although, as depicted, electrode 202 is located within plasma bulb 130, other configurations may be contemplated. For example, in some embodiments, electrode 202 may be located outside of plasma bulb 130. In these embodiments, the electrons are effectively steered by electrode 202, but are not ultimately absorbed by electrode 202. In yet another example, electrode 201 may be employed to emit charged particles into working gas 102 by photoelectric emission, but multiple electrodes may be employed to direct the flow of charged particles through working gas 102. In the depicted example, the differing voltages of electrode 201 and 202 generate an electric field that drives the flow of charged particles through working gas 102. However, in some other embodiments, different voltages may be applied to electrode 201 and another electrode (not shown). In these embodiments, the electric field generated between these electrodes drives the flow of charged particles through working gas 102.

Similar to the embodiment described with reference to FIG. 1, the flow of working gas 205 in plasma bulb 130 is actively controlled by control of the voltages supplied to each of the electrodes of the LSP light source 100. In the embodiment depicted in FIG. 2, command signal 206 is communicated from computing system 210 to voltage source 120. Voltage source 120 supplies a voltage difference between electrodes 201 and 202 based on command signal 206.

In some examples, computing system 210 determines the desired voltage levels of each electrode based on an image of plasma 107. In some other examples, computing system 210 determines the desired voltage levels of each electrode based on operating conditions of LSP light source 100 (e.g., luminious flux or intensity of incoming light 103, luminous flux or intensity of collectable illumination 104, temperature of plasma 107, temperature of plasma bulb 130, etc.). In these examples, computing system 210 is configured to receive one or more signals indicative of operating conditions of LSP light source 100 and determine control signal 206 based at least in part on the received signals.

Light emitted from plasma 107 is employed to stimulate photoelectric emission from electrode 201. The complete spectrum of radiation emitted from plasma 107, or a portion of the spectrum, may be utilized. For example, radiation outside of the wavelength band of interest for use in sample illumination may be utilized to stimulate photoelectric emission from electrode 201. Additional optical elements (e.g., reflectors or other light-collecting optics) may be employed to direct plasma radiation to electrode 201. In other examples, plasma bulb 130 may be specifically constructed to focus light emitted from plasma 107 toward electrode 201 that would otherwise be wasted. For example, light emitted from plasma 107 in directions that cannot be used for sample illumination may be reflected from surfaces of plasma bulb 130 toward electrode 201. In some examples, specific bulb shapes may be employed to focus otherwise wasted light toward electrode 201. In some examples, special purpose mirrors may be disposed inside or outside of plasma bulb 130 to focus otherwise wasted light toward electrode 201. In addition, the electric current 204 generated by photoelectric emission may be controlled by the proximity of electrode 201 to plasma 107.

In some embodiments, non-transparent portions of plasma bulb 130 may be used as the source of charged particles. For example, a portion of the plasma bulb 130 may be constructed of metal or coated with a dielectric material and perform as described with reference to electrode 201.

In another further aspect, an electric arc is sustained within the working gas of the plasma bulb. The heat plume generated by the sustained electric arc causes the working gas to flow through the plasma, increasing convection around the plasma and laser to plasma interaction.

Figure 3:
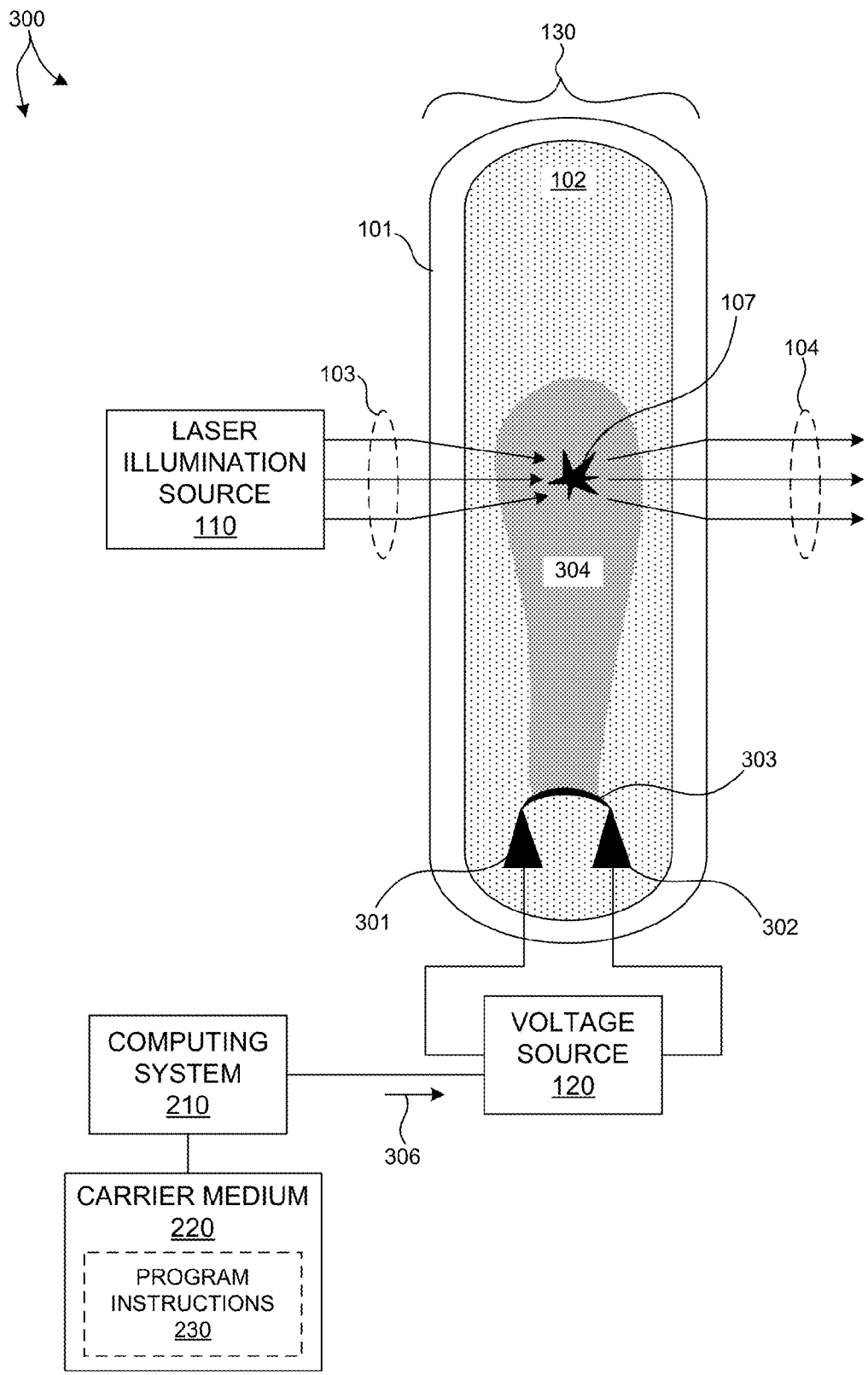
FIG. 3 is a simplified diagram illustrative of a laser sustained plasma light source 300 in a third embodiment including a flow of working gas generated by heat emitted by an electric arc.

FIG. 3 illustrates LSP light source 300 in another embodiment of the present invention. As illustrated in FIG. 3, LSP light source 300 includes similar, like numbered elements described with reference to FIG. 1. However, in the configuration illustrated in FIG. 3, an electric arc 303 is sustained between electrodes 301 and 302 within the working gas of the plasma bulb. The heat generated by the sustained flow of charged particles from electrode 301 to electrode 302 causes a plume 304 of working gas to flow through the plasma 107.

As depicted in FIG. 3, electrodes 301 and 302 are coupled to voltage source 120. In the depicted embodiment, voltage source 120 is configured to supply a voltage difference between electrodes 301 and 302 to sustain an electric arc 303 between the electrodes.

Similar to the embodiment described with reference to FIG. 1, the flow of working gas 304 in plasma bulb 130 is actively controlled by control of the voltages supplied to each of the electrodes of the LSP light source 100. In the embodiment depicted in FIG. 3, command signal 306 is communicated from computing system 210 to voltage source 120. Voltage source 120 supplies a voltage difference between electrodes 301 and 302 based on command signal 306. In the embodiment depicted in FIG. 3, the heat generated by the electric arc 303, and hence the resulting working gas flow 304, is controlled by the voltage difference between electrodes 301 and 302.

In some examples, computing system 210 determines the desired voltage levels of each electrode based on an image of plasma 107. In some other examples, computing system 210 determines the desired voltage levels of each electrode based on operating conditions of LSP light source 100 (e.g., luminous flux or intensity of incoming light 103, luminous flux or intensity of collectable illumination 104, temperature of plasma 107, temperature of plasma bulb 130, etc.). In these examples, computing system 210 is configured to receive one or more signals indicative of operating conditions of LSP light source 100 and determine control signal 306 based at least in part on the received signals.

Figure 4:
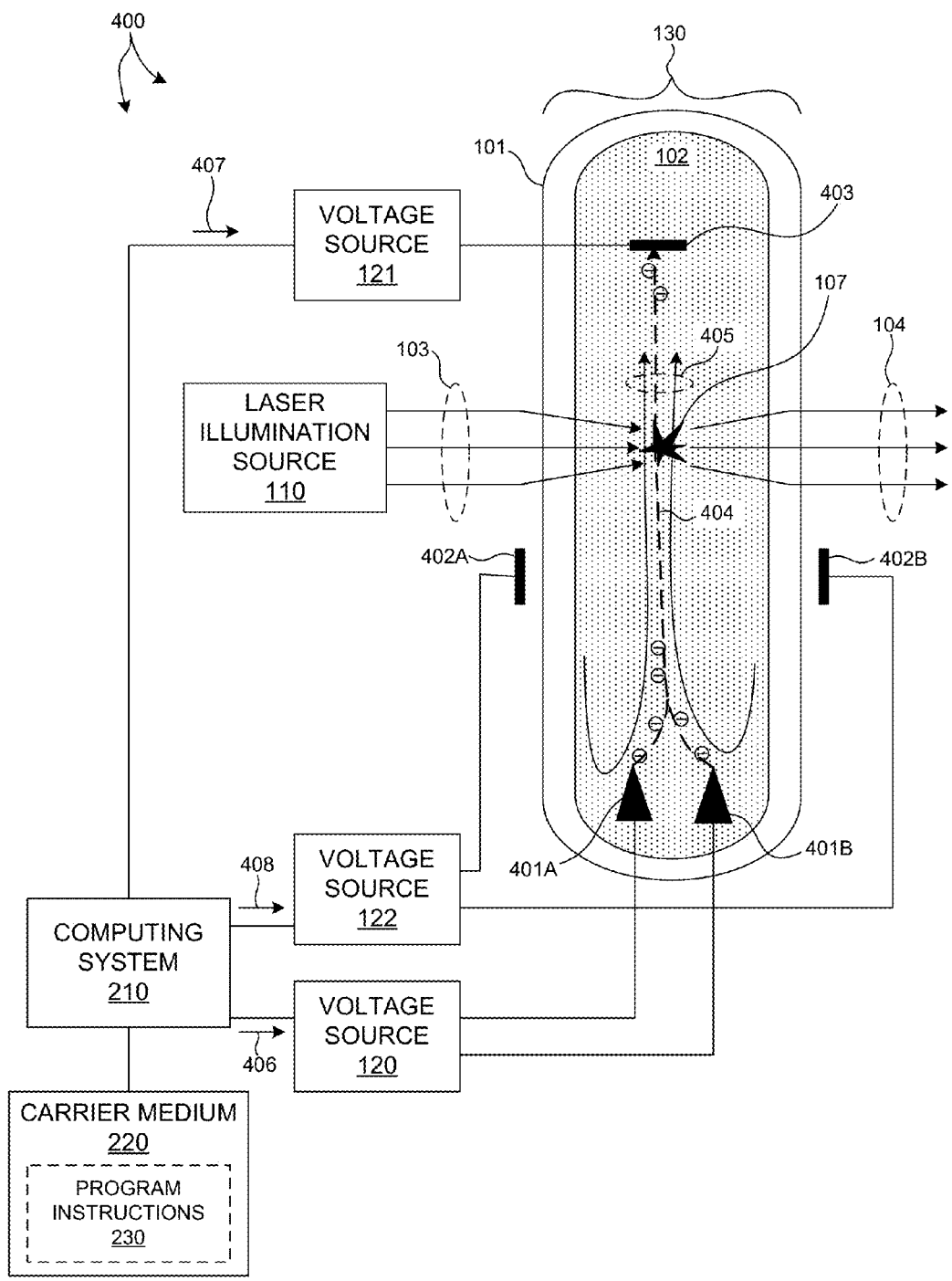
FIG. 4 is a simplified diagram illustrative of a laser sustained plasma light source 400 in a fourth embodiment including a flow of charged particles controlled by multiple electrodes.

FIG. 4 illustrates LSP light source 400 in another embodiment of the present invention. As illustrated in FIG. 4, LSP light source 400 includes similar, like numbered elements described with reference to FIG. 1. However, in the configuration illustrated in FIG. 4, multiple electrodes are separately controlled to both generate charged particles and steer the charged particles through working gas 102. The use of multiple electrodes introduces additional control flexibility over the working gas flow within plasma bulb 130. This may enable improved stabilization of plasma shape and location.

In one aspect, multiple electrodes configured to generate charged particles enables control over the distribution of charged particles introduced into the working gas 102. In the embodiment depicted in FIG. 4, electrodes 401A and 401B are located within plasma bulb 130. In addition, electrode 403 is also located within plasma bulb 130 and is separated from electrodes 401A and 401B. Electrodes 401A and 401B are shaped with a sharp point to promote corona discharge from each electrode.

As depicted, electrodes 401A and 401B are coupled to a voltage source 120. In the depicted embodiment, voltage source 120 is configured to supply a high, negative voltage to electrode 401A to stimulate the discharge of electrons from the tip of electrode 401A and is further configured to supply a separately controllable high, negative voltage to electrode 401B to stimulate the discharge of electrons from the tip of electrode 401B. As depicted in FIG. 4, voltage source 120 is a multiple channel voltage source operable to supply the same or different voltages to electrodes 401A and 401B. However, other voltage supply configurations may be contemplated.

In addition, voltage source 121 is coupled to electrode 403 and is configured to supply a positive voltage to electrode 403 in response to command signal 407 generated by computing system 210 to attract the electrons emitted from electrodes 401A and 401B. Although voltage sources 120 and 121 are depicted as separate voltage sources, in some other embodiments, a single voltage source may be configured to supply the desired voltage difference between electrodes 401A, 401B, and 403. An electric current 404 results from the movement of electrons from electrodes 401A and 401B to electrode 403. The flow of electrons entrains a portion of working gas 102. This results in a working gas flow 405 that passes through the region of plasma 107.

In one further aspect, the flow of working gas 405 in plasma bulb 130 is actively controlled by control of the voltages supplied to electrodes 401A and 401B of the LSP light source 400. In the embodiment depicted in FIG. 4, command signal 406 is communicated from computing system 210 to voltage source 120. Voltage source 120 supplies a voltage level to electrode 401A and another voltage level to electrode 401B based on command signal 406. The different voltage levels supplied to electrodes 401A and 401B affects the spatial distribution of charged particles introduced into working gas 102. For example, if a larger, negative voltage is supplied to electrode 401A than electrode 401B, the distribution of charged particles introduced into working gas 102 will skew toward the left side of plasma bulb 130 as viewed from the perspective of FIG. 4. Hence, for example, if the location of plasma 107 is determined to be off-center, the spatial distribution of charged particles introduced by electrodes 401A and 401B may be controlled to compensate for the change of location of plasma 107.

In another further aspect, an array of electrodes located around the plasma bulb 130 enables steering of the electric current flowing through working gas 102 in multiple dimensions. In particular, the electric current flowing through working gas 102 may be controlled to compensate for asymmetric flow patterns within plasma bulb 130.

Figure 5:
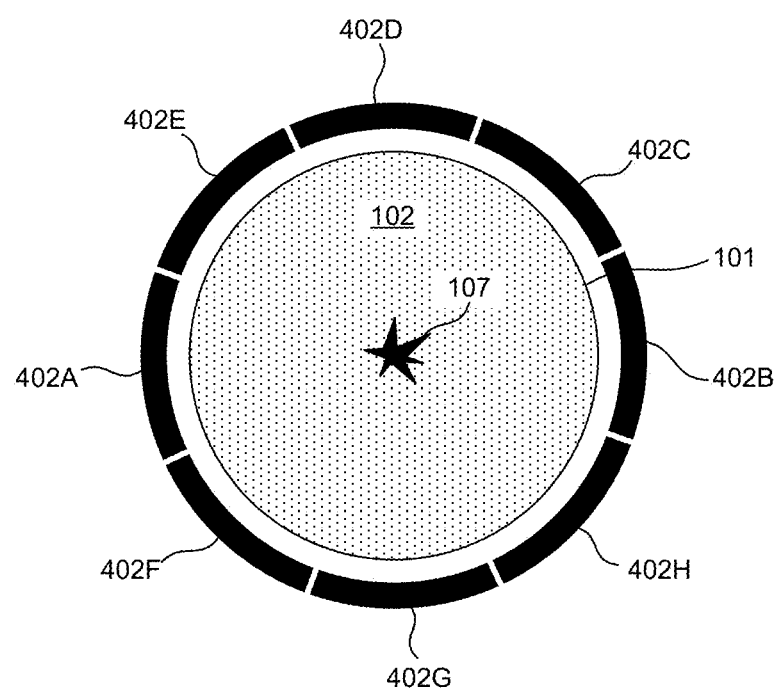
FIG. 5 is a simplified diagram illustrative of an array of electrodes 402 in a top view.

In the example depicted in FIG. 4, the difference in voltage between electrodes 401A and 403 and the difference in voltage between electrodes 401B and 403 generates an electric field that drives the flow of charged particles through working gas 102. However, in addition, as depicted in FIG. 5, LSP light source 400 includes an array of electrodes 402A-H arranged around the periphery of plasma bulb 130. The electric field generated between each of these electrodes and electrodes 401A, 401B, and 403 effectively steers the flow of charged particles through working gas 102. Different voltages may be supplied to each of the electrodes 402A-H by voltage source 122. In the embodiment depicted in FIGS. 4 and 5, voltage source 122 is a multiple channel voltage source configured to supply a separately controllable voltage to electrode each of electrodes 402A-H in accordance with command signal 408 generated by computing system 210. However, other voltage supply configurations may be contemplated within the scope of this disclosure.

As depicted in FIGS. 4 and 5, the array of electrodes 402 is located outside of plasma bulb 130. However, in other embodiments, one or more of the array of electrodes may be located inside plasma bulb 130. In addition, as depicted in FIGS. 4 and 5, the array of electrodes 402 is arranged in a ring around plasma bulb 130. However, in general, the array of electrodes may be arranged in any suitable configuration to reshape the electric field and thus control the strength and shape of the electric current 404. In some embodiments, one or more electrodes of the array of electrodes 402 may be part of the plasma bulb 130. For example a portion of the wall 101 or another structural element of plasma bulb 130 may be configured as an electrode. These elements could be specially modified (e.g., coated, plated, etc.) for use as electrodes or employed as electrodes without modification. Moreover, in general, the number of electrodes employed to generate or repel charged particles does not have to match the number of electrodes employed to attract charged particles.

In some examples, computing system 210 determines the desired voltage levels of each electrode based on an image of plasma 107. In some other examples, computing system 210 determines the desired voltage levels of each electrode based on operating conditions of LSP light source 100 (e.g., luminious flux or intensity of incoming light 103, luminous flux or intensity of collectable illumination 104, temperature of plasma 107, temperature of plasma bulb 130, etc.). In these examples, computing system 210 is configured to receive one or more signals indicative of operating conditions of LSP light source 100 and determine control signals 406, 407, and 408 based at least in part on the received signals.

In yet another further aspect, additional structures may be included within plasma bulb 130 to control the working gas flow. For example, mechanical baffles may be located within plasma bulb 130 to constrain the flow of working gas.

In yet another further aspect, the voltage levels supplied to each electrode may be controlled such that the polarity of any electrode is reversed. In this manner, an electrode may be selectively controlled to both repel and attract charged particles drifting within working gas 102 depending on the supplied voltage. In one example, the gas flow could be reversed by switching the polarity of the voltage supplied to electrodes influencing the gas flow.

In yet another aspect, the electric current flowing though working gas 102 may be modulated to alter the plasma 107 (e.g., stabilize or modulate the radiation generated by the plasma). In some examples, the electric current may be modulated by supplying time-varying voltages to the electrodes. In some examples, the electric current may be modulated by exposing the electric current to a time-varying magnetic field. For example, one or more electro-magnets may be located in the proximity of plasma bulb 130 and configured to generate a time varying magnetic field within plasma bulb 130. For embodiments based on photoelectric generation of charged particles, the electric current may be modulated by controlling the exposure of the electrode to photons in a time-varying manner.

In general, a LSP light source configured in accordance with the present invention may include specially designed structures to promote the emission of charged particles into the working gas. In one example, the electrode material may be arranged on a filament. A current may be passed through the filament to generate heat that stimulates emission of charged particles (i.e., thermionic emission). In some examples, thermionic emission may be enhanced by exposure of the filament to radiation emitted from the plasma or the laser illumination source to further increase the temperature of the filament. In another example, radio frequency discharges or Tesla coils may be employed to generate charge carriers.

Figure 6:
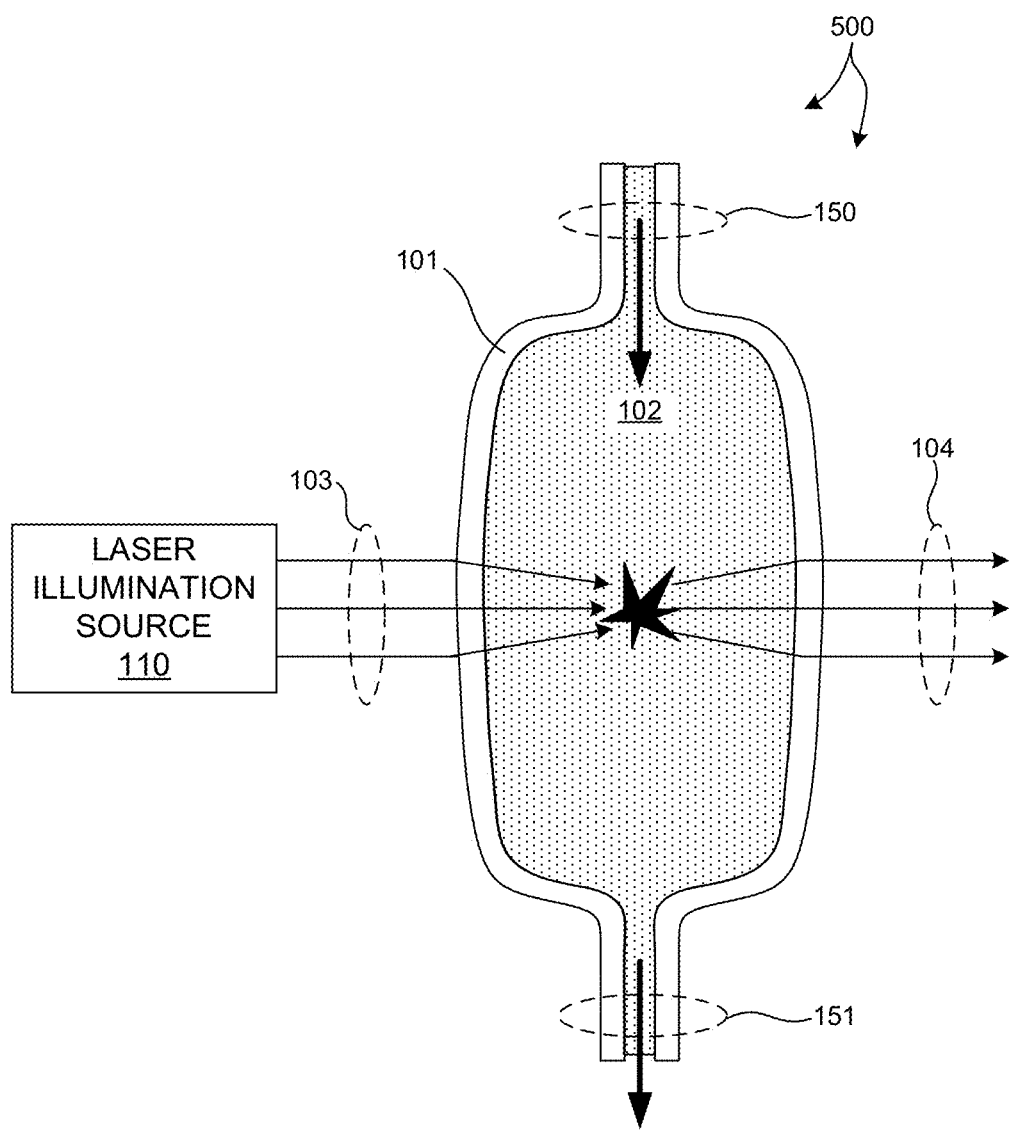
FIG. 6 is a simplified diagram illustrative of a laser sustained plasma light source 500 in another embodiment including a flow of working gas through a plasma bulb.

In another further aspect, the flow of working gas within plasma bulb 130 may be influenced by flowing working gas through the plasma bulb. FIG. 6 illustrates LSP light source 500 in another embodiment of the present invention. As illustrated in FIG. 6, LSP light source 500 includes similar, like numbered elements described with reference to FIG. 1. However, the plasma bulb includes an entrance port 150 and an exit port 151. Working gas 102 flows through the plasma bulb during operation. In this manner, the various embodiments and examples described herein may be implemented in the context of a plasma bulb having a continuous flow of working gas through the plasma bulb itself.

Figure 7:
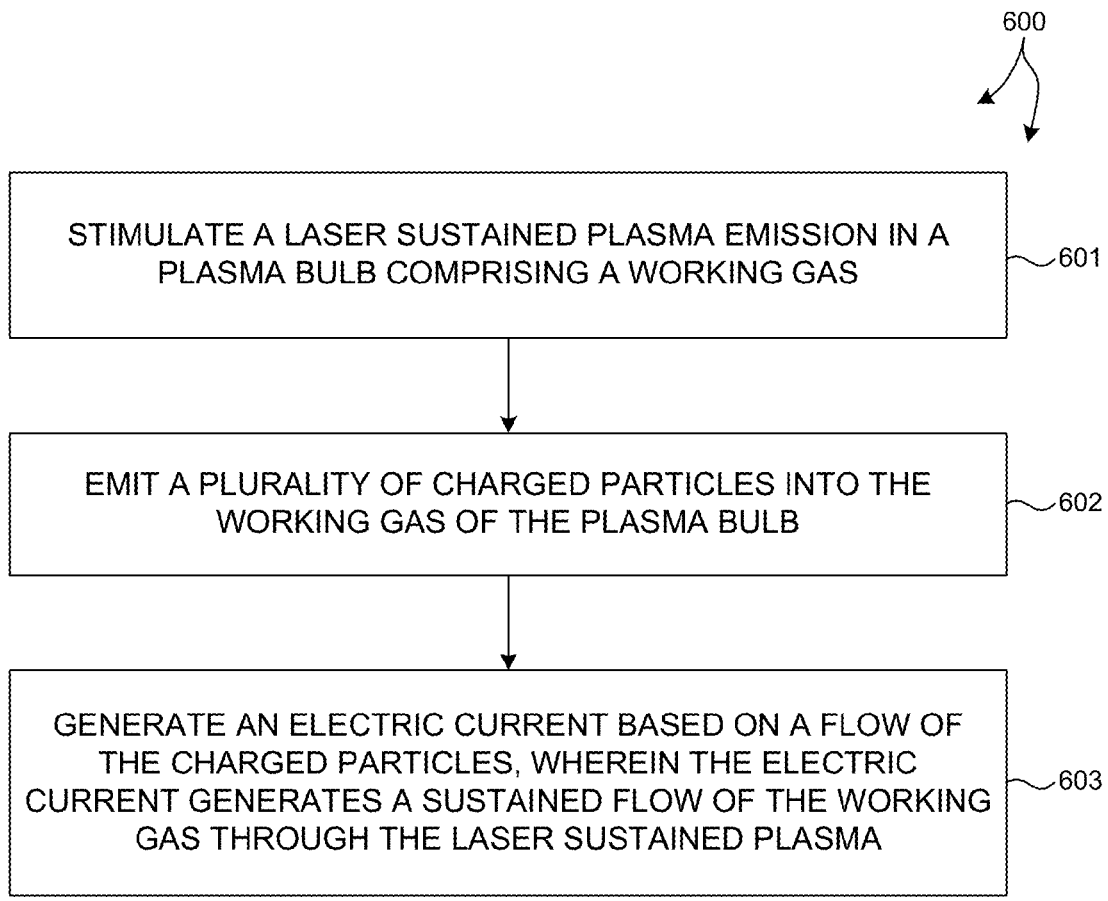
FIG. 7 is a flowchart illustrative of one exemplary method 600 suitable for generating a sustained flow of a working gas through a plasma bulb of a laser sustained plasma light source.

FIG. 7 illustrates a method 600 suitable for controlling a working gas flow in a plasma bulb of a laser sustained plasma light source in accordance with at least one inventive aspect. It is recognized that data processing elements of method 600 may be carried out via a pre-programmed algorithm stored as part of program instructions 230 and executed by one or more processors of computing system 210. While the following description is presented in the context of plasma bulb 130 depicted in FIGS. 1-6, it is recognized herein that the particular structural aspects of plasma bulb 130 do not represent limitations and should be interpreted as illustrative only.

In block 401, a laser sustained plasma emission is stimulated in a plasma bulb comprising a working gas. In block 402, a plurality of charged particles is emitted into the working gas of the plasma bulb. In block 403, an electric current is generated in the plasma bulb based on a flow of the charged particles. The electric current generates a sustained flow of the working gas through the laser sustained plasma. In another block (not shown) the electric current present in the plasma bulb is controlled by controlling an electric field in the plasma bulb. The electric field is controlled by supplying a first voltage to a first electrode and supplying a second voltage to a second electrode separated from the first electrode by an amount of the working gas.

In another aspect of the present invention, the illumination source used to pump the plasma may include one or more lasers. In a general sense, the illumination source may include any laser system known in the art. For instance, the illumination source may include any laser system known in the art capable of emitting radiation in the infrared, visible, or ultraviolet portions of the electromagnetic spectrum. In some embodiments, the illumination source includes a laser system configured to emit pulsed laser radiation. In some other embodiments, the illumination source may include a laser system configured to emit continuous wave (CW) laser radiation. For example, in settings where the gas of the volume is or includes argon, the illumination source may include a CW laser (e.g., fiber laser or disc Yb laser) configured to emit radiation at 1069 nm. It is noted that this wavelength fits to a 1068 nm absorption line in argon and as such is particularly useful for pumping the gas. It is noted herein that the above description of a CW laser is not limiting and any CW laser known in the art may be implemented in the context of the present invention.

In another embodiment, the illumination source may include one or more diode lasers. For example, the illumination source may include one or more diode lasers emitting radiation at a wavelength corresponding with any one or more absorption lines of the species of the gas of the plasma cell. In a general sense, a diode laser of the illumination source may be selected for implementation such that the wavelength of the diode laser is tuned to any absorption line of any plasma (e.g., ionic transition line) or an absorption line of the plasma-producing gas (e.g., highly excited neutral transition line) known in the art. As such, the choice of a given diode laser (or set of diode lasers) will depend on the type of gas utilized in the plasma cell of the present invention.

In some embodiments, the illumination source may include one or more frequency converted laser systems. For example, the illumination source may include a Nd:YAG or Nd:YLF laser. In other embodiments, the illumination source may include a broadband laser. In other embodiments, the illumination source may include a laser system configured to emit modulated laser radiation or pulse laser radiation.

In another aspect of the present invention, the illumination source may include two or more light sources. In one embodiment, the illumination source may include two or more lasers. For example, the illumination source (or illumination sources) may include multiple diode lasers. By way of another example, the illumination source may include multiple CW lasers. In a further embodiment, each of the two or more lasers may emit laser radiation tuned to a different absorption line of the gas or plasma within the plasma cell.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as quartz. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A laser sustained plasma light source, comprising: a laser operable to generate an amount of illumination light; and a plasma bulb having at least one wall operable in part to contain a working gas, wherein the illumination light generated by the laser is incident on the working gas and generates a laser sustained plasma emission; a first electrode configured to emit a plurality of charged particles into the working gas of the plasma bulb; and a second electrode configured to attract a portion of the plurality of charged particles and generate a flow of charged particles from the first electrode toward the second electrode, wherein the flow of charged particles generates a flow of the working gas through the laser sustained plasma; a voltage source coupled to at least one electrode of the laser sustained plasma source, wherein the voltage source generates a voltage difference between at least two electrodes of the laser sustained plasma source; a controller coupled to the voltage source, wherein the controller is operable to control the voltage difference between the at least two electrodes of the laser sustained plasma source such that the flow of the working pas through the laser sustained plasma is controlled.

2. The laser sustained plasma light source of claim 1, further comprising:
a third electrode disposed within the plasma bulb, wherein a voltage difference between the first electrode and the second electrode is different than a voltage difference between the first electrode and the third electrode.

3. The laser sustained plasma light source of claim 1, further comprising:
a plurality of electrodes disposed along a periphery of the plasma bulb outside of the plasma bulb, wherein a voltage difference between at least one of the plurality of electrodes disposed along the periphery and the first electrode steers the flow of charged particles within the plasma bulb.

4. The laser sustained plasma light source of claim 3, wherein a first voltage is applied to a first of the plurality of electrodes disposed along the periphery and a second voltage is applied to a second of the plurality of electrodes disposed along the periphery.

5. The laser sustained plasma light source of claim 1, further comprising:
at least one optical element configured to focus a portion of the laser sustained plasma emission to the first electrode to stimulate the emission of the plurality of charged particles into the working gas.

6. The laser sustained plasma light source of claim 1, wherein the second electrode is a portion of the at least one wall of the plasma bulb.

7. The laser sustained plasma light source of claim 1, wherein an electric arc is sustained between the first electrode and the second electrode, and wherein a heat plume generated by the electric arc generates the flow of the working gas through the laser sustained plasma.

8. The laser sustained plasma light source of claim 1, further comprising:
a mechanical flow control structure disposed within the plasma bulb.

9. The laser sustained plasma light source of claim 1, wherein the emission of the plurality of charged particles into the working gas of the plasma bulb from the first electrode is stimulated by any of: a voltage applied to the first electrode, a heating of the first electrode by an electric arc, a heating of the first electrode by passing a current through the first electrode, and absorption of photons by the first electrode.

10. A method comprising: stimulating a laser sustained plasma emission in a plasma bulb comprising a working gas; emitting a plurality of charged particles into the working gas of the plasma bulb; and generating an electric current based on a flow of the charged particles, wherein the electric current generates a controlled flow of the working gas through the laser sustained plasma; wherein the generating of the electric current involves generating a controlled electric field in the plasma bulb including the plurality of charged particles, and wherein the generating of the controlled electric field involves supplying a first voltage to a first electrode and supplying a second voltage to a second electrode separated from the first electrode by an amount of the working gas: controlling the first voltage and the second voltage such that a voltage difference between the first and second electrodes controls the sustained flow of the working gas through the laser sustained plasma.

11. The method of claim 10, further comprising: supplying a third voltage to a third electrode disposed along a periphery of the plasma bulb, wherein a voltage difference between the third electrode and the first electrode steers the electric current within the plasma bulb.

12. The method of claim 10, further comprising: focusing a portion of the laser sustained plasma emission to the first electrode to stimulate the emitting of the plurality of charged particles into the working gas of the plasma bulb.

13. The method of claim 10, wherein the second electrode is a portion of at least one wall of the plasma bulb.

14. The method of claim 10, wherein the generating of the sustained flow of the working gas through the laser sustained plasma involves generating an electric arc between a first electrode and a second electrode separated from the first electrode by an amount of the working gas.

15. A laser sustained plasma light source comprising:
a laser operable to generate an amount of illumination light;

a plasma bulb having at least one wall operable in part to contain a working gas, wherein the illumination light generated by the laser is incident on the working gas and generates a laser sustained plasma emission;

a first electrode configured to emit a plurality of charged particles into the working gas of the plasma bulb;

a second electrode configured to attract a portion of the plurality of charged particles and generate a flow of charged particles from the first electrode toward the second electrode, wherein the flow of charged particles generates a flow of the working gas through the laser sustained plasma; and a computer configured to control the flow of the working gas through the laser sustained plasma by controlling a voltage difference between the first and second electrodes.

16. The laser sustained plasma light source of claim 15, wherein the controlling the voltage difference between the first and second electrodes involves:

receiving an indication of an operating condition of the laser sustained plasma light source; and determining a command signal to be communicated to a voltage source coupled to the second electrode.

* * * * *